United States Patent
Kim et al.

(10) Patent No.: US 12,237,162 B2
(45) Date of Patent: Feb. 25, 2025

(54) SMALL-VOLUME UHV ION-TRAP PACKAGE AND METHOD OF FORMING

(71) Applicants: Duke University, Durham, NC (US); Coldquanta, Inc., Boulder, CO (US)

(72) Inventors: Jungsang Kim, Chapel Hill, NC (US); Geert Vrijsen, Durham, NC (US); Ismail Inlek, Durham, NC (US); Tom Noel, Boulder, CO (US); Megan Ivory, Boulder, CO (US); Alexander Kato, Boulder, CO (US); Steve Hughes, Boulder, CO (US)

(73) Assignees: Duke University, Durham, NC (US); ColdQuanta, Inc., Boulder, CO (US)

( * ) Notice: Subject to any disclaimer, the term of this patent is extended or adjusted under 35 U.S.C. 154(b) by 881 days.

(21) Appl. No.: 17/371,899

(22) Filed: Jul. 9, 2021

(65) Prior Publication Data
US 2021/0335591 A1    Oct. 28, 2021

Related U.S. Application Data

(60) Continuation-in-part of application No. 16/913,932, filed on Jun. 26, 2020, which is a division of
(Continued)

(51) Int. Cl.
*H01J 49/42* (2006.01)
*H01J 49/16* (2006.01)
*H01J 49/24* (2006.01)

(52) U.S. Cl.
CPC ........... *H01J 49/422* (2013.01); *H01J 49/16* (2013.01); *H01J 49/24* (2013.01); *H01J 49/42* (2013.01)

(58) Field of Classification Search
None
See application file for complete search history.

(56) References Cited

U.S. PATENT DOCUMENTS

| | | | |
|---|---|---|---|
| 4,039,828 A | 8/1977 | Pokar et al. |
| 4,607,493 A | 8/1986 | Sukenobu |
| | | (Continued) | |

FOREIGN PATENT DOCUMENTS

| | | |
|---|---|---|
| CN | 1828818 A | 9/2006 |
| CN | 104040359 A | 9/2014 |
| | (Continued) | |

OTHER PUBLICATIONS

Brown et al. ("Co-designing a scalable quantum computer with trapped atomic ions", arxiv.org, Cornell University U8RARY, 201 Oun Library Cornell University Ithaca, NY 14853 (Feb. 9, 2016)).*
(Continued)

*Primary Examiner* — Andrew Smyth
(74) *Attorney, Agent, or Firm* — Kaplan Breyer Schwarz, LLP (57) ABSTRACT

Aspects of the present disclosure describe systems, methods, and structures that enable a compact, UHV ion trap system that can operate at temperatures above cryogenic temperatures. Ion trap systems in accordance with the present disclosure are surface treated and sealed while held in a UHV environment, where disparate components are joined via UHV seals, such as weld joints, compressible metal flanges, and UHV-compatible solder joints. As a result, no cryogenic pump is required, thereby enabling an extremely small-volume system.

14 Claims, 9 Drawing Sheets

Related U.S. Application Data application No. 15/935,312, filed on Mar. 26, 2018, now Pat. No. 10,755,913.

(60) Provisional application No. 62/533,927, filed on Jul. 18, 2017, provisional application No. 63/049,842, filed on Jul. 9, 2020.

(56) References Cited

U.S. PATENT DOCUMENTS

| | | | |
|---|---|---|---|
| 6,169,004 | B1 | 1/2001 | Mizuno et al. |
| 6,660,340 | B1 | 12/2003 | Kirkpatrick |
| 6,777,673 | B2 | 8/2004 | Chang et al. |
| 7,411,187 | B2 | 8/2008 | Monroe et al. |
| 7,709,807 | B2 | 5/2010 | McClelland et al. |
| 7,859,350 | B1 | 12/2010 | Schwindt et al. |
| 8,558,202 | B2 | 10/2013 | Yanagida et al. |
| 8,829,425 | B1 | 9/2014 | Yang et al. |
| 8,835,833 | B2 | 9/2014 | Du et al. |
| 9,207,672 | B2 | 12/2015 | Williams et al. |
| 9,607,271 | B2 | 3/2017 | Papile |
| 9,791,370 | B2 | 10/2017 | Goeders et al. |
| 9,858,531 | B1 | 1/2018 | Monroe et al. |
| 10,553,414 | B2 | 2/2020 | Youngner et al. |
| 10,755,913 | B2 | 8/2020 | Kim et al. |
| 2003/0122070 | A1 | 7/2003 | Chang et al. |
| 2006/0169882 | A1 | 8/2006 | Pau et al. |
| 2006/0289747 | A1 | 12/2006 | Schultz et al. |
| 2007/0040113 | A1 | 2/2007 | Monroe et al. |
| 2008/0296483 | A1 | 12/2008 | McClelland et al. |
| 2009/0101806 | A1 | 4/2009 | Masuda |
| 2009/0212204 | A1 | 8/2009 | McBride |
| 2009/0279667 | A1 | 11/2009 | Rogers et al. |
| 2010/0084549 | A1 | 4/2010 | Ermakov et al. |
| 2010/0123075 | A1 | 5/2010 | Dantus et al. |
| 2011/0006202 | A1 | 1/2011 | Correale |
| 2012/0112056 | A1 | 5/2012 | Brucker et al. |
| 2015/0034820 | A1 | 2/2015 | Evans-Nguyen et al. |
| 2016/0305882 | A1 | 10/2016 | Goeders et al. |
| 2016/0322188 | A1 | 11/2016 | Youngner |
| 2017/0330739 | A1 | 11/2017 | Hosaka |
| 2018/0233338 | A1 | 8/2018 | Hughes |
| 2019/0027355 | A1 | 1/2019 | Kim et al. |
| 2020/0335320 | A1 | 10/2020 | Kim et al. |

FOREIGN PATENT DOCUMENTS

| | | | | |
|---|---|---|---|---|
| CN | 101578684 | B | 10/2014 | |
| CN | 105097412 | A | 11/2015 | |
| CN | 105097414 | | 11/2015 | |
| CN | 105765320 | | 7/2016 | |
| CN | 106683976 | | 5/2017 | |
| CN | 107529342 | | 12/2017 | |
| CN | 111065599 | | 4/2020 | |
| CN | 103354203 | | 10/2023 | |
| EP | 3176809 | A1 | 6/2017 | |
| JP | 5539801 | B2 | 7/2014 | |
| JP | 2016-031849 | A | 3/2016 | |
| WO | 01/15191 | A2 | 3/2001 | |
| WO | 2006/064132 | A1 | 6/2006 | |
| WO | 2006/104096 | | 9/2008 | |
| WO | 2009/025893 | A2 | 2/2009 | |
| WO | 2015/031321 | A1 | 3/2015 | |
| WO | 2016/017712 | A1 | 2/2016 | |
| WO | WO-2016059037 | A1 * | 4/2016 | .......... H01J 49/0031 |

OTHER PUBLICATIONS

Obsil et al. ("A room-temperature ion trapping apparatus with hydrogen partial pressure below 10-11 mBar", arxiv.org, Cornell University Library, 201 Oun Library Cornell University Ithacia, NY 14853 (Apr. 30, 2019)).*

Brown et al. (Co-designing a scalable quantum computer with trapped atomic ions, arxiv.org, Cornell University Library, 2010 Unlibrary Cornell University Ithaca, NY14853 (Feb. 9, 2016)).*
OBSILe tal. A room-temperature ion trapping apparatus with hydrogen partial pressure below 10-11mBar, arxiv.org, Cornell University Library, 2010 Unlibrary Cornell University Ithaca, NY14853 (Apr. 30, 2019)).*
Office Action issued in Chinese patent application No. 201880054984. 8, Jul. 23, 2021, 12 pp. w/ translaon.
Office Action issued in Japanese patent application No. 2020-502428, May 16, 2022, 8 pp. w/ translation.
List of references Mailed on Mar. 18, 2024 for U.S. Appl. No. 18/223,246, 1 page(s).
Non-Final Rejection Mailed on Mar. 18, 2024 for U.S. Appl. No. 18/223,246, 12 page(s).
Final Rejection Mailed on Feb. 13, 2023 for U.S. Appl. No. 16/913,932.
ISA/206—Invitation to Pay Additional Fees Mailed on Sep. 20, 2018 for WO Application No. PCT/US18/042717, 2 page(s).
Non-Final Office Action issued in U.S. Appl. No. 16/913,932, filed Aug. 30, 2022, 16 pp.
List of references Mailed on Aug. 30, 2022 for U.S. Appl. No. 16/913,932.
Office Action issued in Japanese Patent Application No. JP2023-501355 on Feb. 1, 2024 and English Translation thereof.
Extended European Search Report issued in European Patent Application No. 21837680.4, Apr. 16, 2024, 9 pp.
George Atanassov et al., "Antireflectin coatings on KCl single-crystal windows with low optical loss", Thin Solid Films, Jan. 10, 1995, Publisher: Elsevier Science S.A., pp. 256-262, 2+61 (1995).
Notice of Allowance and Fees Due (PTOL-85) Mailed on Jul. 8, 2024 for U.S. Appl. No. 18/223,246, 9 page(s).
Examiner Interview Summary Record (PTOL-413) Mailed on Jul. 3, 2023 for U.S. Appl. No. 16/913,932, 1 page(s).
Examiner Interview Summary Record (PTOL-413) Mailed on Jul. 14, 2023 for U.S. Appl. No. 16/913,932, 2 page(s).
Notice of Allowance and Fees Due (PTOL-85) Mailed on Jul. 3, 2023 for U.S. Appl. No. 16/913,932, 15 page(s).
Requirement for Restriction/Election Mailed on Apr. 12, 2022 for U.S. Appl. No. 16/913,932.
Authorized Officer Shane Thomas, International Search Report and Written Opinion mailed on Oct. 21, 2021 in PCT Patent Application No. PCT/US2021/041143.
P. Obšil, A room-temperature ion trapping apparatus with hydrogen partial pressure below 10-11 mBar, Dec. 2, 2019.
Yuhi Aikyo, Vacuum Characterization of a Compact Room-temperature Trapped Ion System, Jul. 15, 2020.
Non-Final Rejection Mailed on Aug. 30, 2022 for U.S. Appl. No. 16/913,932.
Authorized Officer Shane Thomas, International Search Report and Written Opinion issued in International PCT Application No. PCT/US18/42717 mailed on Nov. 20, 2018.
D T C Allcock et al., Reduction of heating rate in a microfabricated ion trap by pulsed-laser cleaning, Dec. 16, 2011, New Journal of Physics, vol. 13.
D. Stick et al., "Ion trap in a semiconductor chip", doi: 10.1038/nphys171, "nature physics", dated Dec. 11, 2005, pp. 36-39, vol. 2, Publisher: Nature Publishing Group.
English Translation of Office Action issued in related Chinese Patent Application No. 201880054984.8 on Mar. 3, 2021.
Extended European Search Report issued in related EP Patent Application No. 18835570.5 on Mar. 9, 2021.
K. R. Brown et al., "Co-Designing a Scalable Quantum Computer with Trapped Atomic Ions", dated Feb. 10, 2016, pp. 1-11.
Non-Final Office Action received for U.S. Appl. No. 15/935,312, mailed on Oct. 16, 2019, 25 pages.
Notice of Allowance received for U.S. Appl. No. 15/935,312, mailed on Apr. 8, 2020, 11 pages.
Rachel Noek et al., High Speed, High Fidelity Detection of an Atomic Hyperfine Qubit, Nov. 12, 2013, Optics Letters, vol. 38, No. 22.
Requirement for Restriction/Election received for U.S. Appl. No. 15/935,312, mailed on May 6, 2019, 8 pages.

(56) References Cited

OTHER PUBLICATIONS

Ronald P. Manginell et al., "In situ dissolution or deposition of Ytterbium (Yb) metal in microhotplate wells for a miniaturized atomic clock", "Optics Express", dated Oct. 12, 2012, vol. 20, No. 22, Publisher: Optical Society of America.

Wei-Bang et al., A grooved planar ion trap design for scalable quantum information processing, Jul. 31, 2012, Acta Optica Sinica, 0727001.

\* cited by examiner

SMALL-VOLUME UHV ION-TRAP
PACKAGE AND METHOD OF FORMING

CROSS REFERENCE TO RELATED
APPLICATIONS

This application is a continuation-in-part of co-pending U.S. Non-provisional application Ser. No. 16/913,932, filed Jun. 26, 2020, which is a divisional application of U.S. Non-Provisional patent application Ser. No. 15/935,312 (now U.S. Pat. No. 10,755,913), filed Mar. 26, 2018, which claims the benefit of U.S. Provisional Application Ser. No. 62/533,927, filed Jul. 18, 2017, each of which is incorporated by reference as if set forth at length herein.

This application also claims the benefit of U.S. Provisional Patent Application Ser. No. 63/049,842, filed Jul. 9, 2020, which is incorporated by reference as if set forth at length herein.

STATEMENT REGARDING FEDERALLY
SPONSORED RESEARCH

This invention was made with Government support under Federal Grant No. W911NF16-1-0082 awarded by the Army Research Office. The Government has certain rights in the invention.

TECHNICAL FIELD

This disclosure relates generally to quantum computing and, more specifically, to housings for ion traps capable of supporting an ultra-high vacuum environment.

BACKGROUND

Systems using atomic ions are among the leading physical platforms for a practical quantum computer because of their long coherence times, full connectivity between qubits and high-fidelity gate operations. However, unlike qubits based on solid state devices, the integration approach for scaling trapped-ion systems is not obvious. Many novel ideas for engineering complex trapped-ion systems have been outlined to build practical trapped-ion quantum-computing systems.

Trapped-ion experiments, whether they use traditional linear Paul Traps or micro-fabricated surface traps, ultimately rely on a lack of collision events with background gas molecules in order to provide better qubit isolation and perform reliable high-fidelity gates. Critically, pressures in the ultra-high vacuum (UHV) regime ($<1*10^{-11}$ Torr) are required to keep the background gas collision rates low enough to minimize ion-chain reordering events and loss of ions from the trap. Additionally, quantum computation requires high-fidelity gates, necessitating excellent opto-mechanical robustness and stability of a scalable trapped-ion quantum computer. Optical frequencies of lasers driving near-resonant processes should be stabilized to a part in $10^{10}$ range to properly utilize these transitions for qubit manipulation and read-out. Quantum logic gates are often driven using Raman transition, where two far-detuned non-co-propagating beams with precise frequency difference intersect at the location of the ion. Beam path-length and pointing fluctuations of these Raman beams lead to optical phase and intensity fluctuations at the ions, which results in imperfect gates. In order to avoid these problems, the trapped-ion system and the optical elements used for the delivery of the laser beams should be stable against environment noise such as temperature fluctuations, air currents and mechanical vibrations.

In the prior-art, the requirements for a scalable trapped-ion quantum computer have been addressed by employing cryogenic systems, where the volume of the UHV operating area is made small by taking advantage of cryogenic temperature while maintaining its vacuum quality. Unfortunately, cryogenic systems are large and expensive. In addition, closed-cycle cryostats give rise to undesirable vibrations.

A practical, compact trapped-ion system that does not require cryogenic operation would represent an advance in the state of the art.

SUMMARY

The present disclosure enables extremely compact ion-trap systems that can operate at non-cryogenic temperatures in ultra-high vacuum, and that can have system volume less than or equal to 10 cubic centimeters (cc).

An advance is made over the prior art by performing in-situ surface treatment and vacuum sealing of an ion-trap enclosure of an ion-trap system while the ion-trap enclosure is held in an ultra-high vacuum (UHV) environment. As a result, the piece parts that compose the enclosure are joined using only UHV seals, such as weld joints, vacuum flanges, and UHV-compatible solder seals. Furthermore, embodiments in accordance with the present disclosure do not include vacuum valves or pinch-off tubes, which are commonly used in prior-art ion trap enclosures and known to be bulky or unreliable over time. Still further, by establishing a UHV environment prior to sealing the ion trap in the enclosure, the need for large, complex cryogenic vacuum systems is avoided, thereby enabling very low-volume ion trap systems.

An illustrative embodiment in accordance with the present disclosure is an ion-trap system comprising an enclosure that encloses an ion trap in a high-vacuum chamber having a volume of approximately 2 cm$^3$. The enclosure includes a plurality of piece parts that includes a chip carrier on which the ion trap is mounted, a housing, and a lid, where every joint between piece parts of the enclosure is made using a UHV seal that would be suitable for use in a UHV deposition system while located in an environment having a pressure that is less than or equal to $10^{-9}$ Torr. Because the enclosure is sealed while in an ultra-high vacuum state to establish its baseline pressure, the ion-trap system is cryogenic-cooling-system-free. As a result, the chamber and total system can have very small volumes and the ion trap can operate at temperatures above cryogenic temperatures. In some embodiments, the enclosure is fluidically coupled with a vacuum pump prior to being sealed in the UHV environment such that the vacuum pump can further reduce the pressure in the chamber to far below $10^{-10}$ Torr.

In some embodiments, the enclosure includes one or more windows for providing a view port, optical access for a photo-ionization laser signal for loading the ion trap with ions, optical access for a laser signal for ablating material to produce an atomic flux within the chamber, providing one or more laser signals used to initialize, manipulate and readout the trapped ion qubits, and/or collect scattered photons from the trapped ion qubits for imaging and qubit state detection.

An embodiment in accordance with the present disclosure is an ion-trap system comprising: an ion trap disposed on a chip carrier; and an enclosure that encloses the ion trap in a first chamber, wherein the enclosure includes a plurality of piece parts that includes the chip carrier and a housing, and wherein the piece parts of the plurality thereof are joined with a plurality of seals that consists of UHV seals; wherein the first chamber has a pressure that is less than or equal to $10^{-10}$ Torr; wherein the first chamber has an internal volume that is less than or equal to 10 cm$^3$; and wherein the ion-trap system has an operating temperature that is greater than or equal to −50° C.

Another embodiment in accordance with the present disclosure is an ion-trap system comprising: an ion trap disposed on a chip carrier; and an enclosure that encloses the ion trap in a first chamber, wherein the enclosure includes a plurality of piece parts comprising the chip carrier and a housing; a plurality of seals that consists of UHV seals, wherein plurality of seals join the piece parts of the plurality thereof; and an ion pump that is joined with the enclosure via a first UHV seal; wherein the first chamber has a pressure that is less than or equal to $10^{-10}$ Torr; wherein the ion-trap system is cryosorption-pump-free; and wherein the ion-trap system is configured to enable an operating temperature that is greater than or equal to −50° C.

Yet another embodiment in accordance with the present disclosure is a method for forming an ion-trap system, the method comprising: locating an ion trap in a first environment having a first pressure that is less than or equal to $10^{-9}$ Torr, wherein the ion trap is located within a chamber of an enclosure that includes a plurality of piece parts that are joined with a plurality of seals that consists of UHV seals, the chamber being open to the first environment; and forming a first UHV seal to close the chamber off from the first environment while the ion trap and enclosure are located in the first environment.

DETAILED DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Drawing, including any functional blocks that may be labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the figures comprising the drawing are not drawn to scale.

The following terms are defined for use in this Specification, including the appended claims:

"UHV seal" is defined as a seal that is substantially impermeable to small-molecule gases, such a hydrogen, helium, and the like. A UHV seal in accordance with the present disclosure is capable of maintaining a pressure differential of at least $10^{-1}$ Torr across a barrier in which it is located, such as an UHV environment within a chamber sealed using only UHV seals. Examples of UHV seals suitable for use in accordance with the present disclosure include, compressible metal flanges, UHV-compatible solders (e.g., indium, gold-tin, etc.), weld joints, and the like. It should be noted that the definition for a UHV seal provided herein explicitly excludes a vacuum "pinch-off tube", such as those used in prior-art ion trap systems, wherein a tube used to evacuate a chamber and is sealed by mechanical crimping the tube and/or sealing it with solder after a vacuum pressure has been established in the chamber. "non-UHV seal" is defined as a seal that is not suitable for use in a UHV deposition system and/or that is not substantially impermeable to small-molecule gases, such as hydrogen or helium. Examples of non-UHV seals include pinch-off tubes, compressible gaskets made of non-metal materials, non-UHV-compatible solder seals, and the like.

Figure 1:
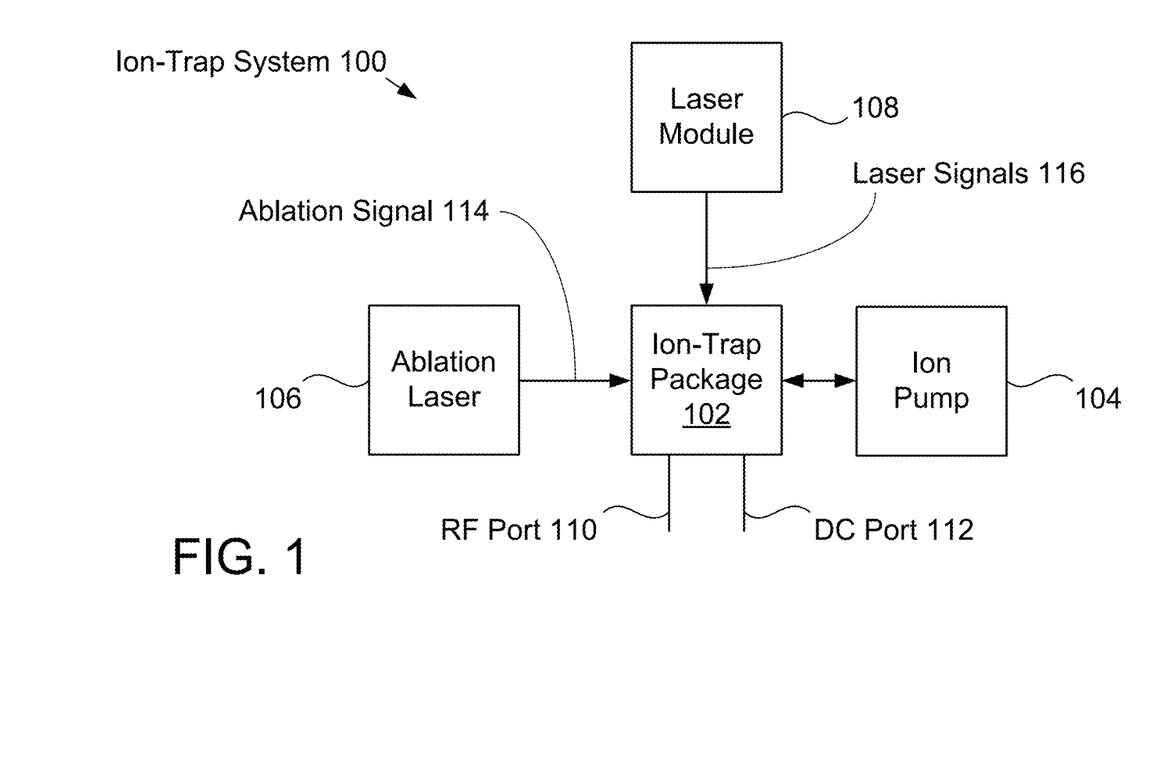
FIG. 1 shows a block diagram of an illustrative ion-trap system in accordance with the present disclosure.

FIG. 1 shows a block diagram of an illustrative ion-trap system in accordance with the present disclosure. Ion-trap system 100 includes ion-trap package 102, ion pump 104, ablation laser 106, and ionization laser 108.

Ion pump 104 is a compact, conventional ion pump that is fluidically coupled with ion-trap package 102.

Ablation laser 106 is a pulsed laser source suitable for providing ablation signal 114 to material within ion-trap package 102 to generate an atomic flux. As discussed below, optical access for ablation signal 114 to the material to be ablated is enabled by the inclusion of a window in ion-trap package 102. In the depicted example, ablation laser 106 is a Q-switched Nd:YAG pulsed laser having a wavelength of 1064 nm that provides 8-ns wide pulses having 0.3 mJ pulse energy; however, other laser sources can be used in ablation laser 106.

Laser module 108 includes conventional laser sources for providing laser signal 116, which includes wavelengths suitable for ionizing neutral atoms within ion-trap package 102, Doppler cooling and detection, and optical re-pumping. In the depicted example, laser module 108 includes continuous wave (CW) lasers having wavelengths of 355 nm, 391 nm, 399 nm, 370 nm, 638 nm, and 935 nm.

RF port 110 and DC port 112 are conventional electrical feed-throughs for enabling external electrical connections for RF and DC electrical signals to the electrodes of ion trap 202.

Figure 2A:
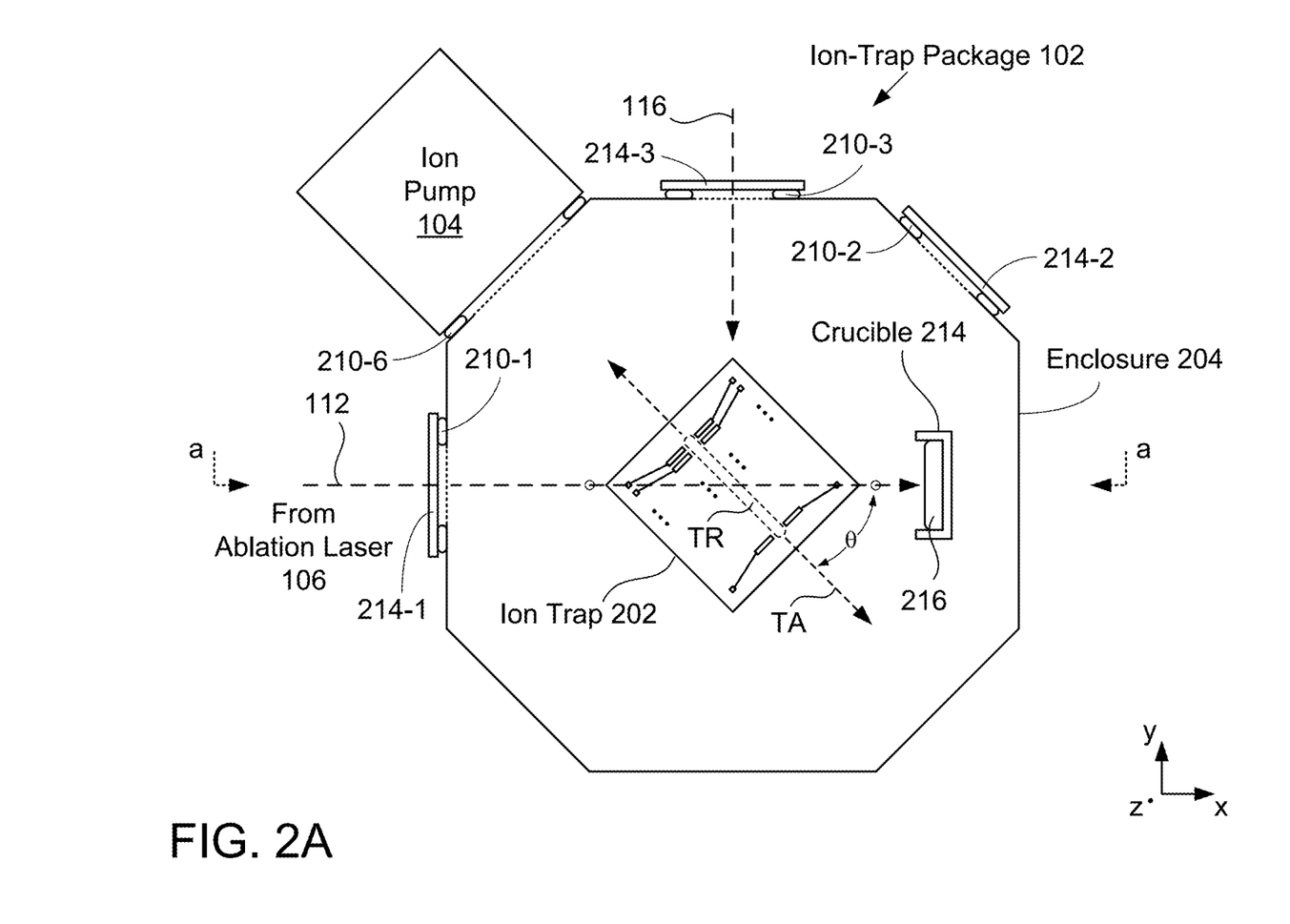
FIGS. 2A-B depict schematic drawings of top and sectional views, respectively, of an ion-trap package in accordance with the illustrative embodiment.
Figure 2B:
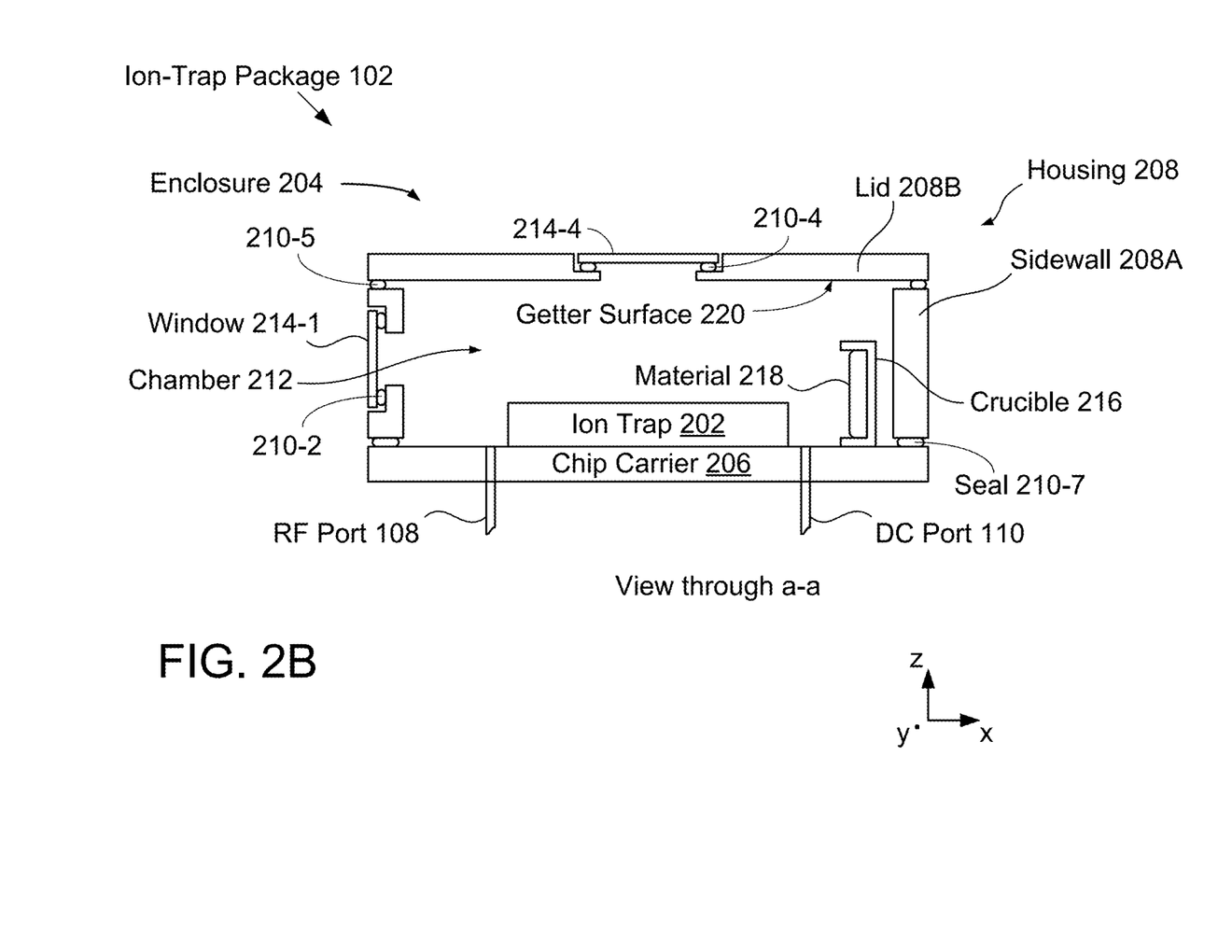

FIGS. 2A-B depict schematic drawings of top and sectional views, respectively, of an ion-trap package in accordance with the illustrative embodiment. The sectional view shown in FIG. 2B is taken through line a-a shown in FIG. 2A.

Ion-trap package 102 includes ion trap 202 and enclosure 204, which encloses the ion trap within an ultra-high vacuum (UHV) environment.

Figure 3:
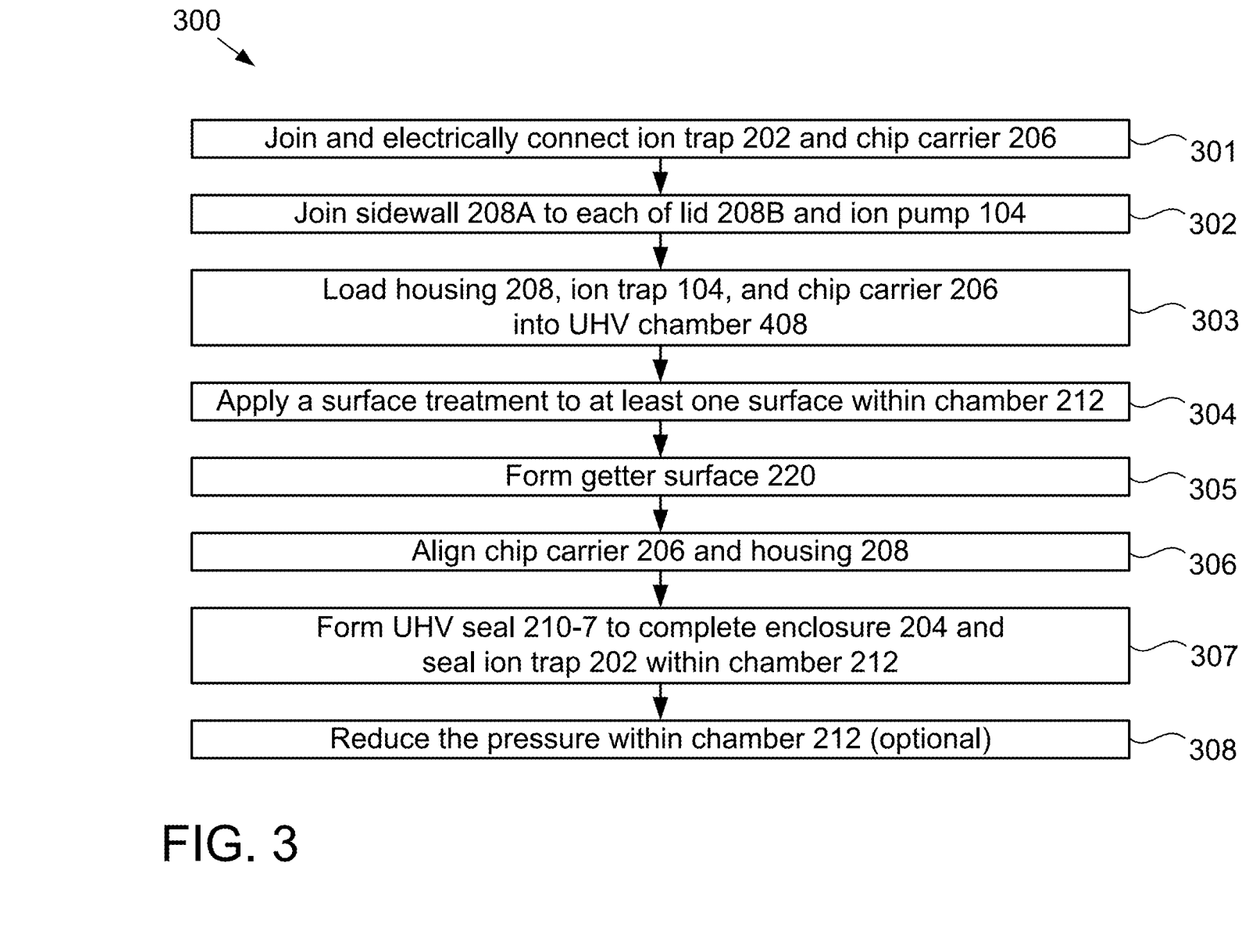
FIG. 3 depicts operations of a method suitable for forming an ion-trap package in accordance with the illustrative embodiment.

FIG. 3 depicts operations of a method suitable for forming an ion-trap package in accordance with the illustrative embodiment. Method 300 is described with continuing reference to FIGS. 1 and 2A-B, as well as reference to FIG. 4. Method 300 begins with operation 301, wherein ion trap 202 is affixed and wire bonded to conventional chip carrier 206.

Ion trap 202 is a conventional micromachined surface ion trap. Examples of surface ion traps suitable for use in accordance with the teachings of the present disclosure include the Sandia National Laboratories HOA 2.0 ion trap, and the like. As will be appreciated by one skilled in the art, a micromachined surface ion trap includes a plurality of electrodes disposed in two one-dimensional arrays on the surface of a substrate such that the electrodes define linear trap region TR between the linear arrays. The longitudinal axis of trap region TR defines trap axis TA.

The electrodes of ion trap 202 are electrically coupled with bond pads, which are wire bonded to RF port 110 and DC port 112 (not shown in FIGS. 2A-B) to enable a desired arrangement of RF and DC electrical signals at the ion trap.

Enclosure 204 includes a plurality of piece parts comprising chip carrier 206 and housing 208, which includes sidewall 208A and lid 208B. In some embodiments, housing 208 is a unitary structure that includes contiguous portions that define sidewall 208A and lid 208B. For example, in some embodiments, housing 208 is machined from a solid block of material, thereby forming a single continuous element that includes sidewall 208A and lid 208B.

In the depicted example, enclosure 204 also includes windows 214-1 through 214-3, which are mounted in sidewall 208B, and window 214-4, which is mounted in lid 208B. Windows 214-1 through 214-4 are affixed within housing 208 via UHV seals 210-1 through 210-4, respectively, such that the windows and UHV seals are substantially impermeable to small-molecule gasses, such as hydrogen, helium, etc. Preferably, windows 214-1 through 214-4 are made of a single-crystal material that also mitigates diffusion of small-molecule gasses.

In the depicted example, each window is sealed to housing 208 via a UHV seal made by first forming a braze joint on the window and then e-beam welding the braze joint to the housing.

At operation 302, sidewall 208A is joined to lid 208B and ion pump 104 at UHV seals 210-5 and 210-6, respectively. Each of UHV seals 210-5 and 210-6 is also substantially impermeable to small-molecule gasses, such as hydrogen, helium, etc. In the depicted example, each of UHV seals 210-5 and 210-6 is a weld joint.

Figure 4:
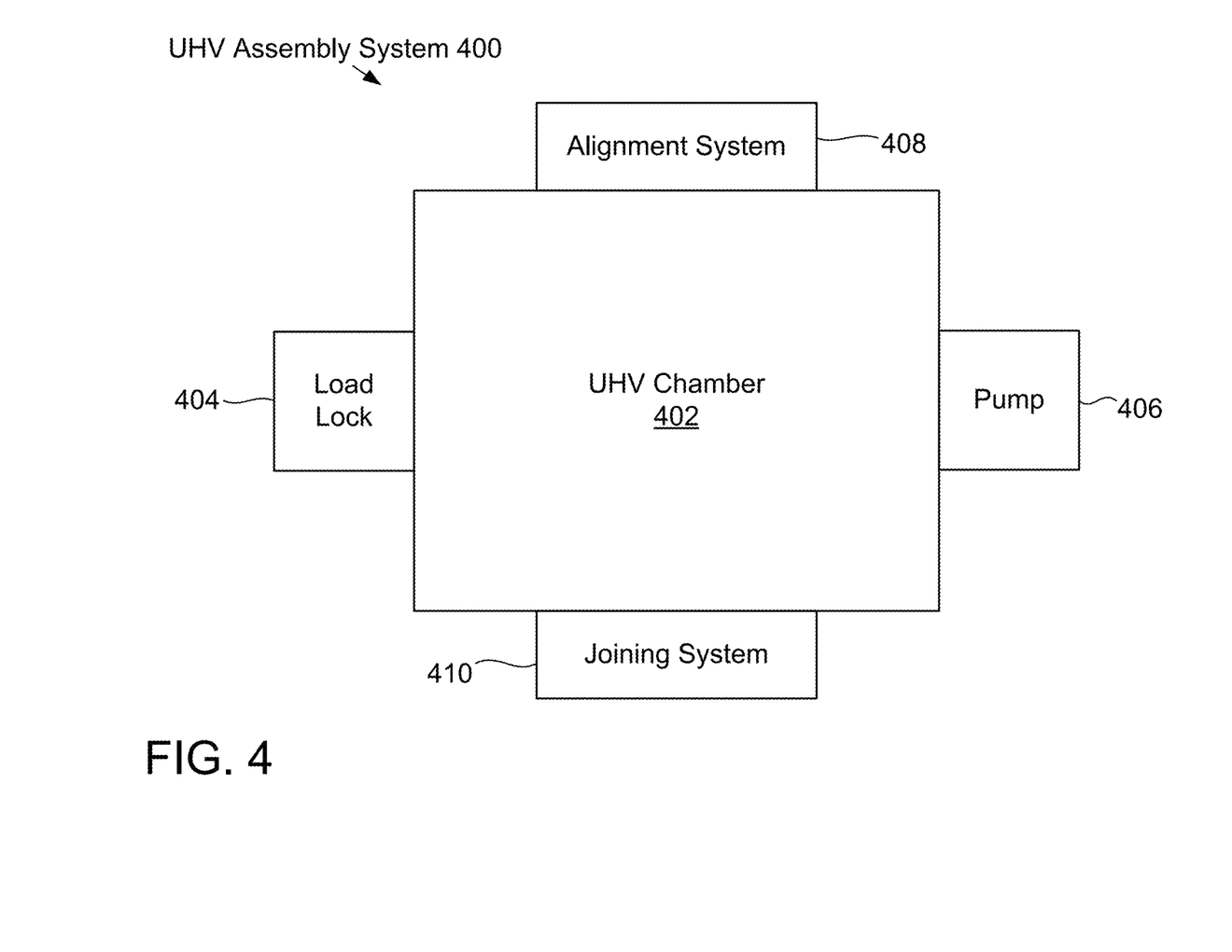
FIG. 4 depicts a block diagram of a UHV assembly system in accordance with the present disclosure.

At operation 303, chip carrier 206 and the partially assembled enclosure comprising housing 208 and ion pump 104 are loaded into UHV assembly system 400.

FIG. 4 depicts a block diagram of a UHV assembly system in accordance with the present disclosure. UHV assembly system 400 is an alignment/joining system that is capable of aligning separate components and joining them while they are under UHV conditions. UHV assembly system 400 includes UHV chamber 402, pump 404, alignment system 406, joining system 408, and load lock 410.

UHV chamber 402 is an environmental chamber capable of maintaining a pressure of less than or equal to $10^{-9}$ Torr.

The chip carrier, housing, and ion pump are placed into the UHV chamber 402 via load lock 404, which is a conventional portal through which piece parts can be loaded into UHV chamber 402 without significant degradation of its UHV environment.

Pump 406 is a conventional UHV pump configured to evacuate UHV chamber to a pressure that is less than or equal to $10^{-9}$ Torr.

Alignment system 408 is a six-degree of freedom alignment system capable of achieving and maintaining a high-precision alignment between multiple piece parts.

At operation 304, a surface treatment, such as ion sputtering, and the like, is applied to at least one surface within chamber 212. In the depicted example, a plurality of surface treatments is performed including Argon-ion beam treatment, plasma treatment, and thermal treatment.

At operation 305, getter surface 220 is formed on lid 208B. In some embodiments, a conventional getter, such as a non-evaporable getter (NEG) is located within chamber 212.

At operation 306, chip carrier 206 and housing 208 are aligned.

In the depicted example, chip carrier 206 and housing 208 are aligned and joined such that trap axis TR is oriented along the ion pump direction and trap axis TA is oriented at angle, θ, relative to the direction of propagation of ablation signal 114. In the depicted example, θ is equal to approximately 45° such that the ablation signal crosses trap region TR at a diagonal.

Optical access for ablation signal 114 is enabled by window 214-1, which allows the ablation signal to access material 218 in crucible 216 to ablate the material and generate an atomic flux. In the depicted example, material 218 is ytterbium (Yb).

In similar fashion, optical access to ion trap 202 for laser signal 116 is enabled by window 214-2.

In the depicted example, each of UHV seals 210-1 through 210-6 is a laser-weld joint. In some embodiments, at least one of UHV seals 210-1 through 210-6 is a different UHV seal, such as a compressible metal flange (e.g., a copper flange, etc.), brazing joint, or UHV-compatible solder ring comprising a material suitable for use in UHV systems such as, without limitation, indium, gold-tin, and the like.

At operation 307, chip carrier 206 and housing 208 are joined via UHV seal 210-7. In the depicted example, UHV seal 210-7 is a solder seal comprising indium. The formation of UHV seal 210-7 completes enclosure 204, thereby sealing ion trap 202 within chamber 212 with an internal UHV environment equivalent to that within UHV chamber 402. In other words, upon completion of operation 304, chamber 212 contains an environment in which the pressure is less than or equal to $10^{-9}$.

In the depicted example, once fully assembled, enclosure 204 has overall dimensions of approximately 130 mm by 100 mm by 70 mm. As will be apparent to one skilled in the art after reading this Specification, however, these dimensions are merely exemplary and enclosure 204 can have any practical physical dimensions without departing from the scope of the present disclosure.

In the depicted example, joining system 410 is an indium-sealing system configured to operate in a UHV environment and UHV seal 210-7 is an indium solder ring. It should be noted, however, that joining systems other than laser-welding systems can be used to join piece parts under UHV conditions without departing from the scope of the present disclosure. In some embodiments, for example, joining system 410 includes a laser-welding system, soldering system and/or system for compressing a compressible metal flange analogous to those used in UHV deposition systems, such as molecular beam epitaxy (MBE) systems, atomic layer epitaxy (ALE) systems, and the like.

In some embodiments, the piece parts of enclosure 204 to be joined are provided with groove rings and frames that interlock to ensure a reliable seal when welded or joined via a compressible metal flange and/or UHV-compatible solder.

It should be noted that, although enclosure 204 is assembled and joined with ion pump 104 prior to placing it in UHV chamber 402 (with the exception of seal 210-6), in some embodiments, more of the enclosure assembly is completed within the UHV chamber itself (e.g., at least one of windows 214-1 through 214-3 and/or the lid is joined to sidewall 208A, and or sidewall 208A is joined with chip carrier 206, etc.). Furthermore, in some embodiments, fully or partially assembled enclosure 204 is joined with ion pump 104 while they are both located within the UHV chamber.

It is an aspect of the present disclosure that the use of only UHV seals to join the piece parts of an enclosure and sealing the enclosure while its internal chamber has a pressure that is less than or equal to $10^{-9}$ Torr affords embodiments with significant advantages over prior-art ion-trap systems, including:

excluding unreliable pinch-off tubes; or enabling operation at temperatures above cryogenic temperatures (e.g., greater than or equal to −50° C.); or significantly smaller overall ion-trap system volume; or enabling an ion-trap system that is cryogenic-pump-free; or any combination of i, ii, iii, and iv.

For example, in the illustrative embodiment, chamber 212 has a volume of only approximately 2 cm³. In some embodiments, the volume of chamber 212 is other than 2 cm³; however, it is preferably less than 10 cm³.

At optional operation 308, the pressure in chamber 212 is reduced to $10^{-10}$ Torr or less. In the depicted example, ion pump 104 is engaged to reduce the pressure within chamber 104 to $2 \times 10^{-11}$ Torr or less.

As will be apparent to one skilled in the art, the quality of the vacuum in a trapped-ion system dictates the lifetime of an ion chain. The elastic-collision rate between the residual background gas molecules and the trapped ions is a critical parameter of a trapped ion-based quantum computer, since these collisions with sufficient kinetic-energy transfer can significantly disrupt a trapped ion chain. To reliably maintain a chain of ions over the periods of time required for quantum computation, the level of vacuum must be in the UHV regime (preferably approximately $10^{-11}$ Torr or better).

It is another aspect of the present disclosure that the pressure inside chamber 212 can be measured (or estimated) by monitoring the behavior of one or more trapped ions.

Figure 5:
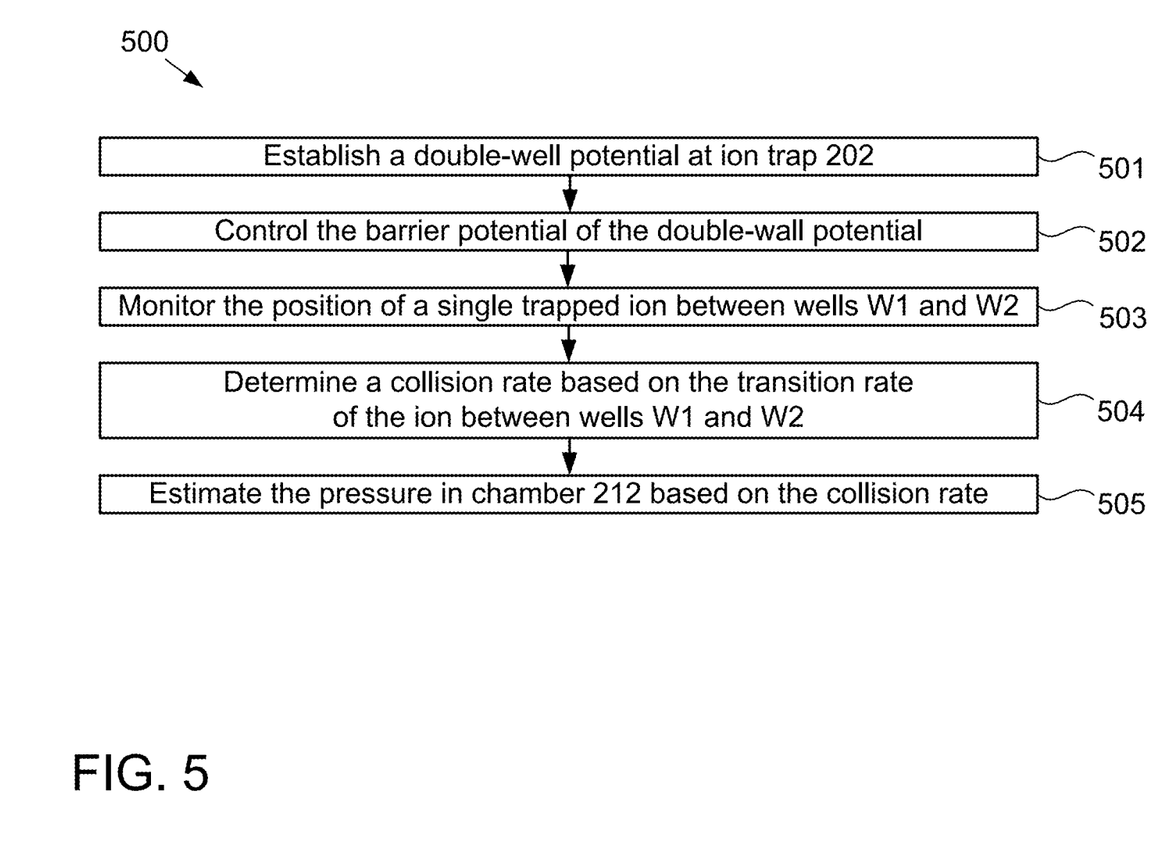
FIG. 5 depicts operations of a method for monitoring the pressure inside an ion-trap system in accordance with the present disclosure.

FIG. 5 depicts operations of a method for monitoring the pressure inside an ion-trap system in accordance with the present disclosure. Method 500 begins with operation 501, wherein a double-well potential is created in ion trap 202.

Figure 6A:
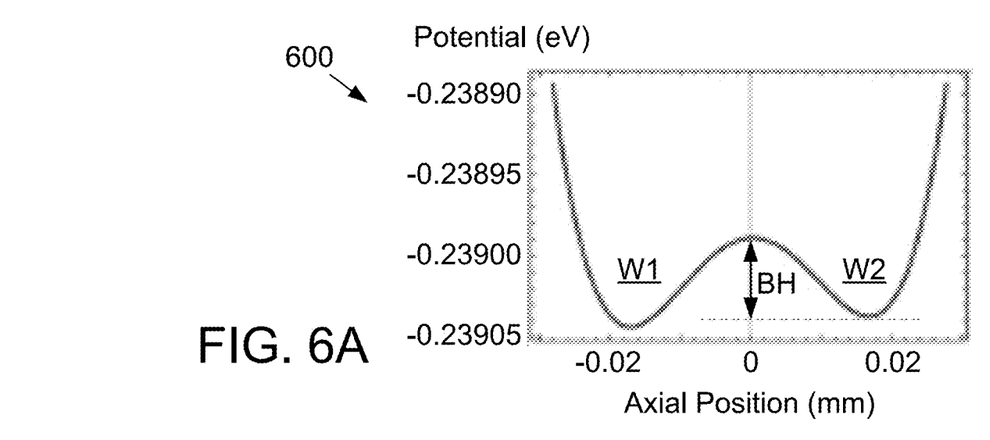
FIG. 6A depicts a simulation of a double-well potential in accordance with the present disclosure.

FIG. 6A depicts a simulation of a double-well potential in accordance with the present disclosure.

Plot 600 depicts ion potential as a function of axial position for conditions wherein the height of the potential barrier between wells W1 and W2, whose minima are significantly lower than the average energy transfer from a collision event (i.e., collision energy).

At operation 502, the potential barrier between the two wells is controlled. In the depicted example, the potential barrier height, BH, is controlled to be 50 μeV, which approximately 40 times lower than the average collision energy $\langle Ei \rangle_\theta$, which is given by:

$$\langle E_i \rangle_\theta = \left\langle \frac{m_i v_i^2}{2} \right\rangle \theta = \frac{2 m_i m_m}{(m_i + m_m)^2} E_m, \quad (1)$$

where $m_i$ and $m_m$ are the mass of the ion and the background gas molecule in the trap, respectively, v is the relative velocity between the ion and the background gas molecule, θ is the scattering angle, and $E_m$ is the initial kinetic energy of a background gas molecule. In the depicted example, the ion is $^{174}$Yb$^+$ and the background gas molecules are $H_2$; therefore, Equation (1) provides an estimated average collision energy $\langle Ei \rangle_\theta$ of approximately 2 meV. Under these conditions, every collision event would be expected to randomize the ion location.

At operation 503, the position of a single trapped ion is monitored between wells W1 and W2. In the depicted example, the position of the trapped ion is determined by imaging the ion location on an electron multiplying CCD (EMCCD) camera to determine which of the two wells contains the ion.

Figure 6B:
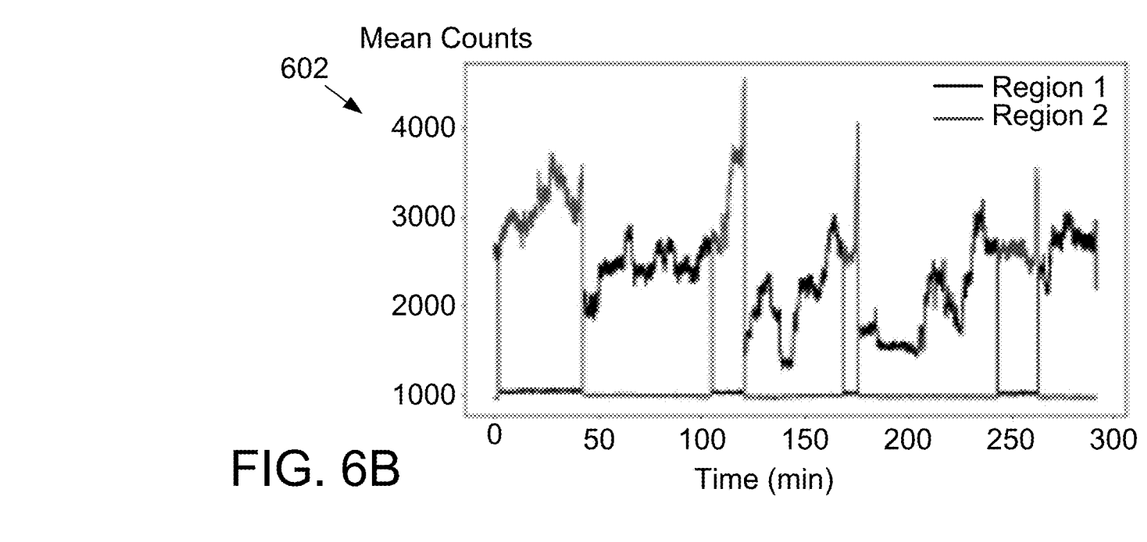
FIG. 6B depicts a plot of the position of a trapped ion between the wells of a double-well potential as a function of time in accordance with the present disclosure.

FIG. 6B depicts a plot of the position of a trapped ion between the wells of a double-well potential as a function of time in accordance with the present disclosure.

Plot 602 depicts sample traces of the total EMCCD signal counts for pixels in the regions where the minima of the two potential wells are located (designated as Region 1 and Region 2), which indicates the position of the ion as a function of time (i.e., the transition rate).

At operation 504, the rate at which the ion transitions between wells W1 and W2 is determined. This transition rate is extracted from plot 602. In the depicted example, the transition rate is 1 event per 32 minutes. The actual collision rate is expected to be roughly twice the measured transition rate, since an ion will eventually be Doppler cooled into either well after a collision.

At operation 505, the pressure in chamber 212 is estimated based on the extracted collision rate. The relationship between collision rate, $\gamma$, and pressure in chamber 212 is given by:

$$\gamma = \frac{PQ}{k_B T} \sqrt{\frac{\pi \alpha}{\mu \varepsilon_0}}, \quad (2)$$

where P is the pressure in chamber 212, Q is the net charge of the trapped ion, T is temperature, $\alpha$ is the polarizability of the background molecule, and $\varepsilon_0$ is the vacuum permittivity.

In the depicted example, $\gamma=1/(16\ min)$, $\mu \approx m_{H2}=3.32 \times 10^{-32}$ kg, $\alpha_{H2}=8*10^{-31}$ m$^3$ and T=300 K. As a result, the pressure at the ion location, P, is equal to $2.2 \times 10^{-11}$ Torr.

In some embodiments, the pressure in a UHV chamber is estimated based on the reordering rate of ions in a chain of ions held in an ion trap.

Figure 7:
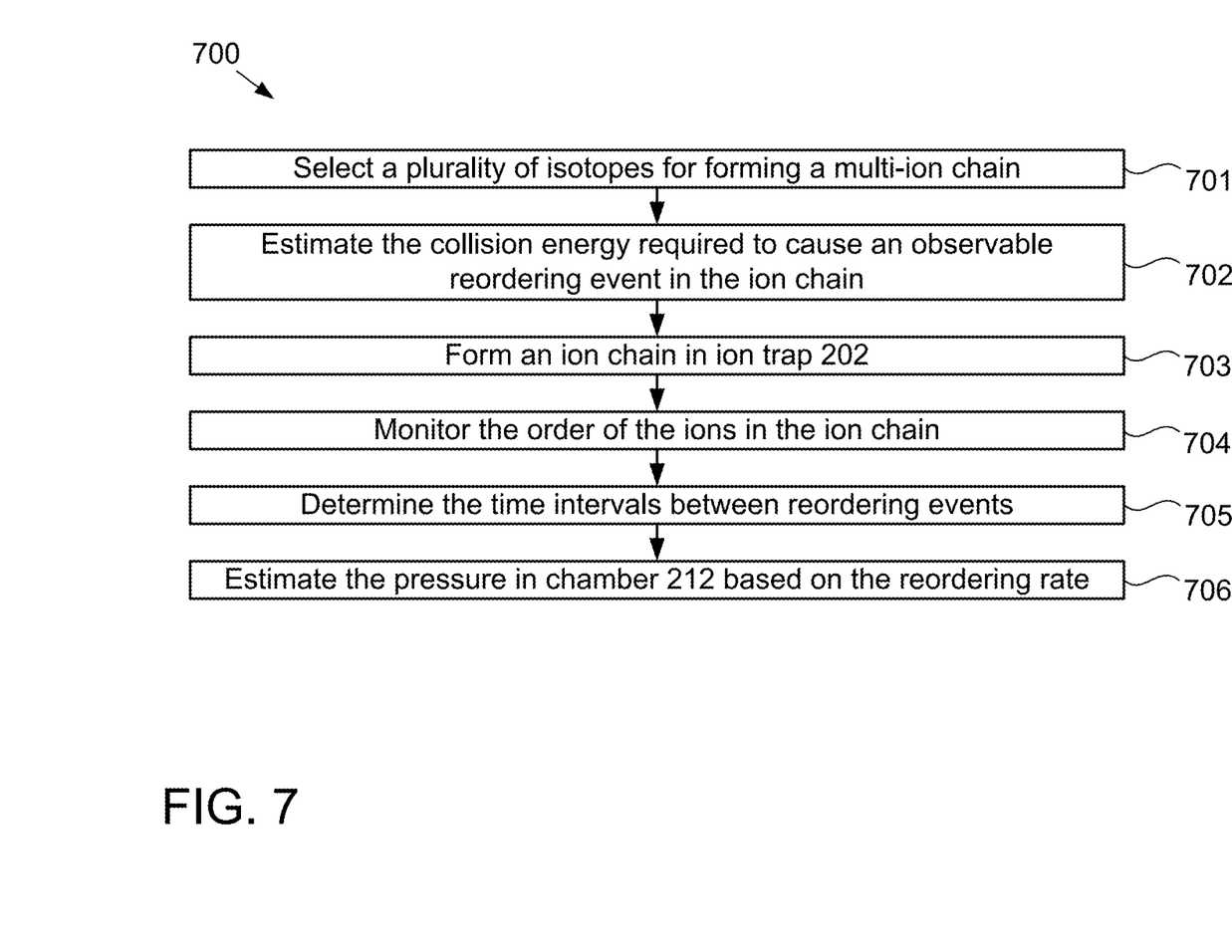
FIG. 7 depicts operations of an alternative method for monitoring the pressure inside an ion-trap system in accordance with the present disclosure.

FIG. 7 depicts operations of an alternative method for monitoring the pressure inside an ion-trap system in accordance with the present disclosure. Method 700 begins with operation 701, wherein isotopes of ions having at least one property different from one another are selected for inclusion in a chain of ions to be trapped in ion trap 202. Selecting ions with a different property enables the order of the ions in the ion chain to be determined. In the depicted example, the isotopes are selected as ions of $^{174}Yb^+$ and $^{172}Yb^+$, which will manifest as bright ions and dark ions, respectively, in ion-trap system 100. In some embodiments, the differing property selected for the multiple isotopes is different than brightness. Examples of other properties that can be selected to differentiate isotopes in accordance with the present disclosure include, without limitation, ion species, ion isotopes, etc.

At operation 702, the collision energy required to give rise to an observable reordering event in the ion chain is estimated.

At operation 703, a chain of the selected ions is trapped in ion trap 202. In the depicted example, the ion chain includes four ions of $^{174}Yb^+$ and two ions of $^{172}Yb^+$. It should be noted that the small difference in the mass of the isotopes can typically be neglected as it does not significantly change the expected energy barrier of 2.2 meV.

Although multiple isotopes are included in the ion chain, only one will be resonant with the Doppler cooling laser (370 nm in the depicted example); therefore, only this isotope will be detected by the EMCCD camera. In the depicted example, the $^{174}Yb^+$ ions are selected as the bright ions, while the two ions of $^{172}Yb^+$ remain dark.

In order to estimate this collision energy, the energy difference between (1) a first chain configuration in which the ions are aligned along the trap axis in their typical configuration and (2) a second chain configuration in which two of the ions have been pushed into one of the transverse axes.

Figure 8A:
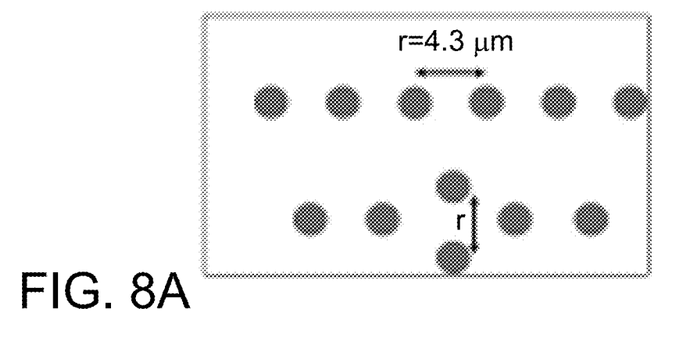
FIG. 8A depicts the first and second chain configurations used to estimate collision energy for the six-ion chain of method 700.

FIG. 8A depicts the first and second chain configurations used to estimate collision energy for the six-ion chain of method 700.

When identical ions are stationary in the trap, the total energy of the chain is given by:

$$U = \frac{m}{2} \sum_{i=1}^{N} (\omega_x^2 X_i^2 + \omega_y^2 Y_i^2 + \omega_z^2 Z_i^2) + \frac{Q^2}{8\pi\varepsilon_0} \sum_{\substack{i,j=1 \\ i \neq j}}^{N} \frac{1}{|R_i - R_j|}, \quad (3)$$

where m is the mass of the ions, $\omega_{x,y,z}$ are the trap frequencies in the x, y, and z directions, respectively, $R_i=(X_i,Y_i,Z_i)$ is the equilibrium position of the i-th ion in the trap and Q is the charge of the ions.

In the depicted example, $\omega_{x,y}$ is equal to 2.7 MHz and $\omega_z$ is equal to 0.32 MHz. As a result, the energy difference between the first and second chain configurations can be determined as approximately 2.2 meV.

As a result, a reordering event can be expected to occur when the ion chain gains energy in excess of about 2.2 meV due to a collision event. This value is close to the estimated average energy exchange in a single collision event as given by Equation (1) above. It can be expected, therefore, that one of two collision events will lead to a reordering event because roughly half of the background molecules will have energy greater than 2.2 meV.

At operation 704, the order of the ions in the ion chain are monitored via an EMCCD camera.

At operation 705, the time intervals between ion reordering events is determined.

Figure 8B:
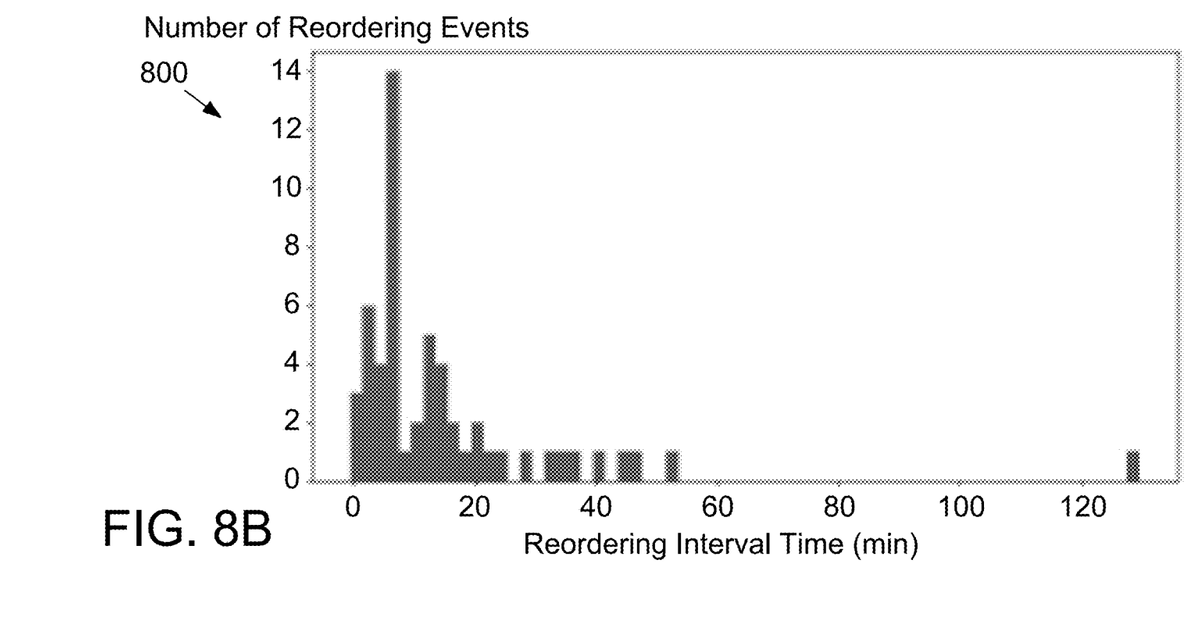
FIG. 8B depicts a histogram of the time intervals between ion-reordering events.

FIG. 8B depicts a histogram of the time intervals between ion-reordering events. Plot 800 shows reordering interval times, in time bins of 2 minutes, for ion-chain reordering events recorded over a 15-hour period.

As shown in plot 800, 54 reordering events were recorded and the average reordering rate is approximately one event per 15.8 minutes. It should be noted that it is estimated that only approximately ⅔ of the reordering events are detected due to some neighboring pairs of ions being identical isotopes. As a result, a correction factor is applied to the recorded data, giving a "true" reordering rate of approximately one event per 10.5 minutes.

It should be noted that if every ion-molecule collision that led to a transition were to give rise to a reordering event, a reordering rate of one event per 5.3 minutes would be expected based on a simple multiplication of the collision rate of a two-ion chain by 3 to account for a six-ion chain. Given that the required energy for a reordering-collision event is approximately 2.2 meV, which is similar to the estimated average energy exchange during a collision event, a measured reordering rate of roughly half that of the collision rate is reasonable.

At operation 706, the pressure in chamber 212 is estimated based on the reordering rate of the ion chain.

It is to be understood that the disclosure teaches just some examples of embodiments in accordance with the present disclosure and that many variations of the invention can easily be devised by those skilled in the art after reading this disclosure and that the scope of the present invention is to be determined by the following claims.

What is claimed is:

1. An ion-trap system comprising:
an ion trap disposed on a chip carrier; and
an enclosure that encloses the ion trap in a first chamber, wherein the enclosure includes a plurality of piece parts that includes the chip carrier and a housing, and wherein the piece parts of the plurality thereof are joined with a plurality of seals that consists of UHV seals;
wherein the first chamber has a pressure that is less than or equal to $10^{-10}$ Torr;
wherein the first chamber has an internal volume that is less than or equal to 10 cm$^3$; and
wherein the ion-trap system has an operating temperature that is greater than or equal to $-50°$ C.

2. The ion-trap system of claim 1 further comprising an ablation oven.

3. The ion-trap system of claim 2 wherein the plurality of piece parts includes a first window.

4. The ion-trap system of claim 3 wherein the first window comprises a single-crystal material that inhibits the diffusion of a small-molecule gas through the window.

5. The ion-trap system of claim 1 wherein at least one seal of the plurality thereof comprises at least one of a weld joint and a braze joint.

6. The ion-trap system of claim 1 wherein the enclosure includes a first surface that is activated to adsorb gas molecules.

7. The ion-trap system of claim 1 further comprising at least one of (1) a getter material and (2) an ion pump.

8. An ion-trap system comprising:
an ion trap disposed on a chip carrier; and
an enclosure that encloses the ion trap in a first chamber, wherein the enclosure includes a plurality of piece parts comprising the chip carrier and a housing;
a plurality of seals that consists of UHV seals, wherein plurality of seals join the piece parts of the plurality thereof; and
an ion pump that is joined with the enclosure via a first UHV seal;
wherein the first chamber has a pressure that is less than or equal to 10-10 Torr;
wherein the ion-trap system is cryosorption-pump-free; and
wherein the ion-trap system is configured to enable an operating temperature that is greater than or equal to $-50°$ C.

9. The ion-trap system of claim 8 wherein the first chamber has an internal volume that is less than or equal to 10 cm$^3$.

10. The ion-trap system of claim 8 wherein at least one seal of the plurality of seals comprises at least one of a weld joint and a braze joint.

11. The ion-trap system of claim 8 further comprising an ablation oven.

12. The ion-trap system of claim 11 wherein the enclosure further includes a first window that is joined with the enclosure at a second UHV seal.

13. The ion-trap system of claim 12 wherein the window comprises a single-crystal material that inhibits the diffusion of a small-molecule gas through the window.

14. The ion-trap system of claim 8 wherein the enclosure includes a first surface that is activated to adsorb gas molecules.

* * * * *